United States Patent [19]

Patel et al.

[11] Patent Number: 5,537,665
[45] Date of Patent: Jul. 16, 1996

[54] MULTIPLE BANK COLUMN REDUNDANCY INTIALIZATION CONTROLLER FOR CACHE RAM

[75] Inventors: Rajiv N. Patel, San Jose, Calif.; Adam Malamy, Winchester, Mass.

[73] Assignee: Sun Microsystems, Inc., Mountain View, Calif.

[21] Appl. No.: 518,659

[22] Filed: Aug. 24, 1995

Related U.S. Application Data

[63] Continuation of Ser. No. 278,572, Jul. 21, 1994, abandoned, which is a continuation of Ser. No. 890,549, May 28, 1992, abandoned.

[51] Int. Cl.⁶ .................................................. G06F 11/00
[52] U.S. Cl. ............. 395/182.03; 365/200; 364/238.4; 364/242.91; 364/DIG. 1
[58] Field of Search ............................ 371/10.2, 10.3, 371/8.1, 21.1, 51.1; 364/184, 186, 187, 238.3, 238.4, 242.91, 243.41; 365/200, 201; 395/182.03, 182.04, 183.18

[56] References Cited

U.S. PATENT DOCUMENTS

| | | | |
|---|---|---|---|
| 4,455,652 | 6/1984 | van der Muelen | 371/16.1 |
| 4,577,294 | 3/1986 | Brown et al. | 371/10.2 |
| 4,598,388 | 7/1986 | Anderson | 371/10.2 |
| 4,601,019 | 7/1986 | Shah et al. | 371/21.1 |
| 4,604,730 | 8/1986 | Yoshida et al. | 365/200 |
| 4,660,179 | 4/1987 | Aoyama | 365/200 |
| 4,691,301 | 9/1987 | Anderson | 371/11 |
| 4,739,498 | 4/1988 | Eichhorn | 371/11 |
| 5,204,836 | 4/1993 | Reed | 371/10.2 |
| 5,297,029 | 3/1994 | Nakai et al. | 365/238.5 |
| 5,400,343 | 3/1995 | Crittenden et al. | 371/21.1 |

*Primary Examiner*—Robert W. Beausoliel, Jr.
*Assistant Examiner*—Dieu-Minh Le
*Attorney, Agent, or Firm*—Blakely, Sokoloff, Taylor & Zafman

[57] ABSTRACT

An apparatus and method for controlling the initialization of shifting circuitry which provides column redundancy for multiple banks of cache memory on-board a microprocessor. Upon sensing deassertion of a reset signal, a master controller supplies non-overlapping two phase clock signals to one bank controller for each bank of the cache memory. Each bank has a set of fuses which supply a bank shift location to the bank controller indicating the location of a bad column in the bank. The master controller also activates a pre-loadable counter which provides each bank controller with a signal which counts down to zero from half the maximum number of columns in a bank. Each bank controller then provides the shifting signals necessary to initialize the shifting circuitry for its bank. In this way, defective columns located in different positions in each bank can be replaced by redundant paths, thereby repairing the cache and increasing the manufacturing yield of microprocessors with an on-board cache memory.

19 Claims, 3 Drawing Sheets

MULTIPLE BANK COLUMN REDUNDANCY INTIALIZATION CONTROLLER FOR CACHE RAM

This is a continuation of application Ser. No. 08/278,572 filed Jul. 21, 1994, now abandoned, which was a continuation of application Ser. No. 07/890,549 filed May 28, 1992, now abandoned.

BACKGROUND OF THE INVENTION

(1) Field of the Invention

The present invention relates to a method and apparatus for minimizing the effects of defects in an integrated circuit chip. More specifically, the present invention controls the initialization of shifters with a shift pattern for column redundancy in highly parallel memory structures such as the multiple banks of a cache memory on a microprocessor integrated circuit chip.

(2) Prior Art

It is quite common for a fast central processor unit to feature parallel data paths such as a 32 bit or a 64 bit bus for transferring data into and out of its memory storage. Likewise, most memory storage comprises semi-conductor memories organized in rectangular arrays of rows and columns on very-large-scale integrated (VLSI) circuits. The intersection of one row and one column results in a storage element called a "cell". Each cell is capable of storing a binary bit of data. To write data into, and to read data from, a row or column of cells, an address is assigned to each row or column of cells. Access to the address is provided by a binary coded address presented as input to address decoders that select a row or column for a write or read operation. As semiconductor memories become more and more dense, the arrays of cells become more and more susceptible to the presence of defects which could impede or corrupt the flow of data through any of the desired paths.

Defects in semi-conductor memories occur during the fabrication of an integrated circuit. Under the rubric of defects, one may include wafer defects, oxide defects, metallization defects, interconnect defects, contamination defects, unintended or missing connections, missing or extra contacts and others. To avoid unnecessarily confusing the presentation of the invention, an "open" defect refers to a defect affecting the data path for one bit of data, while a "short" defect refers to a defect affecting the paths of more than one bit of data (typically adjacent bits).

On-chip redundancy is the construction of redundant elements on an integrated chip to bypass the data paths affected by the defects while preserving the original addresses of the affected data paths. For example, if the chip contains a memory array, redundant elements are provided. Thus, if a defect in one or more primary data elements is detected, the redundant elements can be switched into use in place of the defective primary element or elements.

In the past, on-chip redundancy was implemented with latches or laser zappable fuses located on each column or row of data path. Latches are volatile and require that the information identifying the cells affected by defects be stored externally to the semi-conductor memory, for example, on a disk, so that when power is turned on, the entire system does not have to be retested for defects. The fuses are used to resolve a defect or error found in the original data elements such that signals are shifted to use the redundant data elements, thereby avoiding the defective elements.

Laser zappable fuses are physically implemented in CMOS circuits in one of two ways. If the fuse is "normally closed," it is usually made with a polysilicon fuse which can be opened by selective laser zapping. If the fuse is "normally open," it is usually made with a NMOS or a PMOS transistor whose gate voltage is controlled by "normally closed" laser zappable fuses.

The use of latches or laser zappable fuses on each column or row of data path imposes technology constraints. In particularly, to avoid damage to surrounding circuitry when a fuse is "zapped," considerable space must be allowed between each fuse and other fuses or other unrelated circuitry. The additional area required for the fuses is generally contradictory with the tight spacing requirements inherent in memory arrays.

As applicable to wide-word computing such as the popular use of 32-bit or 64-bit data paths, a number of additional problems arise. A single redundant set of arrays cannot compensate for a short defect between arrays belonging to two adjacent sets. Therefore, at least two sets would be needed to correct such defects. Additionally, data transmissions along the redundant path can suffer a speed penalty due to the extra line length and the incidence of higher parasitic capacitance. In some instances, the input and output data path may be tripled in length for a wide-word computing device. Variable delays from data paths are highly undesirable in high-performance memory storage, as they force the performance of an entire memory array to be no better than that of the extended length path's performance. Finally, fuses must be laid out integrally to each set so as to be able to selectively disconnect sets in which defects exist.

An apparatus and method for switching the arrays of parallel data paths in memory data structures upon the detection of defects in the data path or memory storage device is disclosed in co-pending U.S. patent application Ser. No. 07/605,510, entitled "Method and Apparatus for Implementing Redundancy in Parallel Memory Structures" which was filed on Oct. 30, 1990 and is hereby incorporated fully by reference. Prior to the invention of the co-pending application, redundancy had been implemented using duplicate arrays connected to laser zappable fuses. The use of laser fuses imposes restrictive technology constraints. In particular, to avoid damage to surrounding circuitry when a fuse is "zapped," considerable space must be allowed between each fuse and other fuses or other unrelated circuitry. The co-pending application uses only two extra parallel arrays to correct for any open or short defects in a parallel memory data structure, and it makes the correction with nearly constant array lengths which are about the same as the original arrays. The redundancy arrays as well as the original arrays are connected to toggle switches. Upon encountering any open or short in the one or more data paths, the toggle switches coupled to the data paths affected by the open or short are "flipped" to connect to the adjacent data paths in a cascading fashion. The toggle switches are implemented with NMOS or PMOS transistors in a CMOS array. It follows that the co-pending application invention obviates having a latch or laser zappable fuse on each column or row of data path. The toggle switches are controlled with a pointer register which can be implemented either by logically decoding the defect area or by actually implementing a shifter which stops when its state reaches the defect.

As microprocessors become more and more sophisticated, and as the die sizes grow, it is common for a microprocessor integrated circuit chip to include several memory arrays (e.g. cache memories, translation look-aside buffers) on the integrated circuit chip. It is also common for an individual cache memory to be divided into several banks of highly parallel memory structures. While the teachings of the co-pending invention could be used to repair defects in banks of on-board cache memory simply by duplicating the shifter such that there is one independent control for each shifter, there would be much duplication of logic. The present invention provides a method and apparatus for controlling the initialization of many shifters while minimizing the duplication of logic.

BRIEF SUMMARY OF THE INVENTION

It is therefore an object of the present invention to implement on-chip redundancy within a cache of a microprocessor.

It is a further object of the present invention to provide an on-chip master control of the generation of signals to initialize the redundancy circuitry of multiple banks within the cache.

It is a further object of the present invention to provide the capability to concurrently initialize each bank shifter to a different shift location thereby realizing time savings, in cycles, due to the concurrent operations.

It is a further object of the present invention to minimize the duplication of master control circuitry for the generation of signals to initialize the redundancy circuitry of multiple banks within the cache and thereby minimize the area of the microprocessor chip used for this purpose.

An apparatus and method are disclosed for controlling the initialization of shift patterns for shifting circuitry which provides column redundancy for multiple banks of cache memory on-board a microprocessor. Upon sensing deassertion of a reset signal, a master controller supplies non-overlapping two phase clock signals to the bank controllers for each bank of the cache memory. Each bank has a set of fuses which supply a bank shift location to the bank controller indicating the location of a bad column in the bank. The master controller also activates a pre-loadable counter which provides each bank controller with a signal which counts down to zero from half the maximum number of columns in a bank. Each bank controller then provides the shifting signals necessary to initialize the shifting circuitry for its bank with a shift pattern for the bank. In this way, defective columns located in different positions in each bank can be replaced by redundant paths, thereby repairing the cache and increasing the manufacturing yield of microprocessors with an on-board cache. Furthermore, the master controller keeps the internal chip reset asserted, though external reset has been deasserted, until this column redundancy operation completes.

BRIEF DESCRIPTION OF THE DRAWINGS

The objects, features and advantages of the method and apparatus of the present invention will be apparent from the following detailed description of the invention in which.

DETAILED DESCRIPTION OF THE INVENTION

An apparatus and method is disclosed for controlling the initialization of shift patterns for redundancy shifters in multiple banks of highly parallel data paths or data structures. In the preferred embodiment, an apparatus and method is disclosed for initializing redundancy shifters in multiple banks of cache memory on-board a microprocessor integrated circuit chip. In the following description, for the purposes of explanation, specific devices, signals and data structures are disclosed in order to more thoroughly understand the present invention. However, it will be apparent to one skilled in the art that the present invention may be practiced without the specific details. In other instances, well-known circuits, devices and data structures are not disclosed herein to avoid obscuring the present invention unnecessarily.

Figure 1:
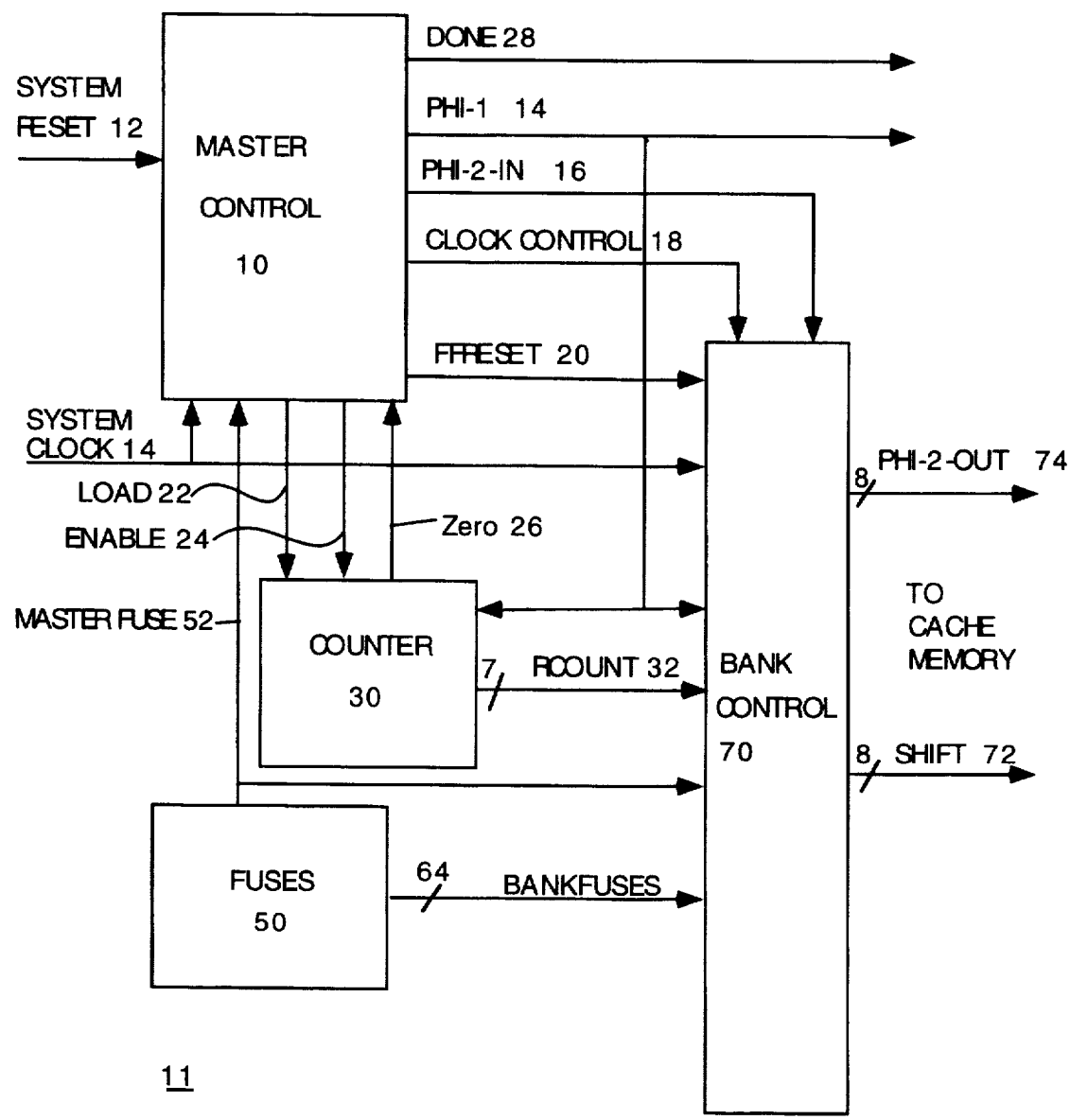
FIG. 1 illustrates a conceptual block diagram of a column redundancy initialization controller.

FIG. 1 illustrates a block diagram of the preferred embodiment of the present invention. In the preferred embodiment, the present invention 11 is used to control the initialization of shift patterns for eight banks of cache memory (not shown) on-board a microprocessor integrated circuit chip. Each of the banks has a shifter which is initialized with a shift pattern. Before initialization, the shifter is in its default state and primary data paths for the bank are used to access elements within the bank. In the event that one or more of the primary data paths in the bank is defective, the shifter is initialized with a shift pattern which causes the shifters to shift around the defective primary data paths thereby supplementing the non-defective primary data paths with redundant data paths when elements within the bank are accessed. In order to maintain substantially uniform access paths to the memory elements, the shifters do not simply replace one of the defective primary data paths with one of the redundant data paths. Instead, the data paths are shifted so that the defective primary data path is replaced with an adjacent non-defective primary data path. Each of the subsequent primary data paths are replaced by their adjacent primary data path until the last primary data path is replaced by a redundant data path which is adjacent to it. Once initialized, the shifter retains the shift pattern until power is removed, or until the shifter has been reinitialized. Conceptually, the present invention comprises four blocks.

The first block, the master control 10, consists of a finite state machine which controls the operation of column redundancy initialization. In the preferred embodiment, the master control 10 has as input a SYSTEM RESET signal line 12 for receiving a SYSTEM RESET signal provided to the microprocessor. The master control 10 starts the column redundancy initialization operation when the SYSTEM RESET signal is deasserted. Preferably a SYSTEM CLOCK signal from the microprocessor is also input into the master control 10 through a SYSTEM CLOCK signal line 14. The master control 10 generates from the SYSTEM CLOCK signals a two phase non-overlapping clock for the shifting operation signals (PHI-1 and PHI-2-IN). However, it will be readily apparent to one skilled in the art that the master control 10 need not use the microprocessor SYSTEM CLOCK signals to generate the two phase non-overlapping clock signals. In an alternate embodiment, the master control 10 could generate the two phase non-overlapping clock signals independent of the SYSTEM CLOCK signals. The outputs of the master control 10 include the two phased clock signals PHI-1 and PHI-2-IN which are output on signal lines PHI-1 14 and PHI-2-IN 16 respectively. For ease of understanding the present invention will be described using a two-phase non-over lapping clock. However, it will be obvious to one skilled in the art that, in general, an N-phase non-overlapping clock could be used, where N has any positive integral value including one. Master control 10 also provides as output signal DONE through a DONE 28 signal line to indicate when the shifter initialization operation has finished. The DONE signal keeps the other logic on the chip in RESET condition until the column redundancy operation is complete.

Other signals which are output from the master control 10 include CLOCK CONTROL and FFRESET which are input to a bank control 70 circuit through CLOCK CONTROL 18 and FFRESET 20 signal lines. Signals LOAD and ENABLE are output from master control 10 to a counter 30 through signal lines LOAD 22 and ENABLE 24 respectively. Signal ZERO is input to master control 10 through signal line ZERO 26. Finally, signal MASTER FUSE is input to master control 10 through a MASTER FUSE signal line 52. The above-mentioned signals will be discussed below in connection with their operation within other blocks of the present invention.

In the preferred embodiment of the present invention, the counter 30 consists of a multiple-bit counter which is used to count the pattern bits to be shifted into the column shifters for each bank in the cache memory. The counter starts from an initial high value and counts down to zero. The master control keeps track of when the count reaches zero which indicates the end of the shifter initialization operations. A detailed description of the workings of the counter 30 appears below in connection with FIG. 2.

The third block of the present invention is a fuse block 50. The fuse block 50 consists of all fuses to be programmed selectively to indicate where repair is to be effected within the banks of the cache. Preferably, all fuses provide a signal having a voltage equal to a source voltage for the system, i.e. VCC, when not blown. One master fuse is used to indicate whether column redundancy correction is needed for the particular chip or not. By default, it is assumed that no column redundancy is required. In the event that no column redundancy is required, the pattern to be shifted is fixed. While it would be possible to skip shifting operations in the event that no column redundancy correction is required, in the preferred embodiment, the column redundancy cycle is still performed. The cycle is performed for debugging and testing purposes in order to provide a uniform delay upon deassertion of the SYSTEM RESET signal between chips which do not require redundancy correction and those that do.

Column redundancy is necessary for one or more banks (preferably eight banks per cache) if the master fuse is blown. In the preferred embodiment, if one bank must be repaired, then all banks are initialized. There are eight sets of fuses, one set per bank. One column to be replaced is programmed into each of the eight sets of fuses. The fuse number specifies a column to be replaced. In the preferred embodiment, two adjacent columns per bank are replaced (actually shifted out of use). However, it will be readily apparent to one skilled in the art that more (or less) adjacent columns per bank could be shifted out of use if so desired.

In the preferred embodiment of the present invention, the bank control block 70 is actually eight identical blocks of logic, one corresponding to each cache bank. In general, more (or less) banks can be controlled similarly. The only difference among the bank control 70 blocks is that each block receives a different fuse value corresponding to the columns to be replaced in the particular bank corresponding to the bank control. Comparator logic in each bank control compares the count with the fuse value to determine which columns are to be shifted. The only portion of logic duplicated to handle column redundancy operation initialization in multiple banks is within this block. A detailed discussion of the operation of a bank control appears below in connection with FIG. 3.

Figure 2:
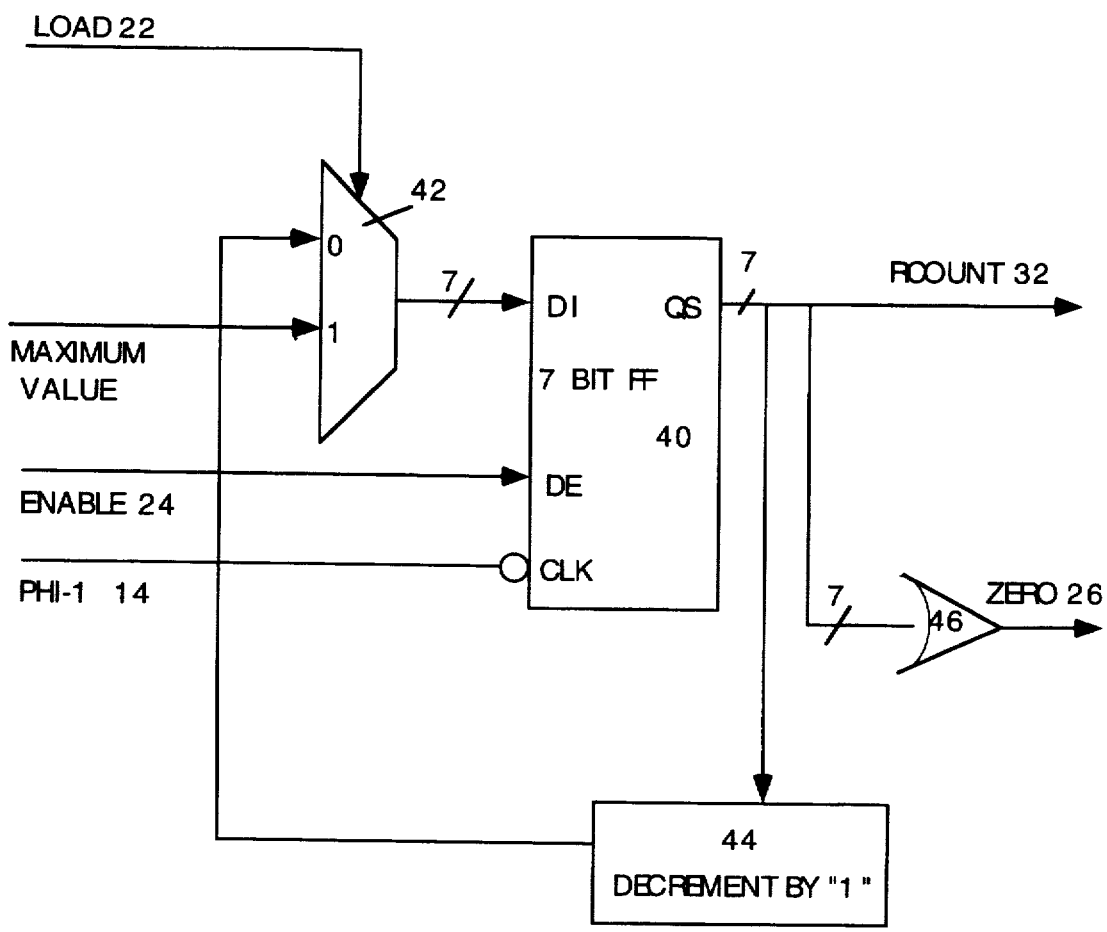
FIG. 2 illustrates a counter which is used to count the pattern bits to be shifted into the column shifters for each bank in memory.

Referring now to FIG. 2, the multiple bit pre-loadable counter 30 is illustrated. There are three inputs to the counter, each of the inputs originates in the master control. The inputs to the counter are the clock signal PHI-1, the counter LOAD signal and the counter ENABLE signal.

One embodiment of the present invention supports a microprocessor having two caches, a data cache and an instruction cache. Both of the caches are comprised of eight banks, however, each bank of the data cache is comprised of 128 (32*4) columns and each bank of the instruction cache is comprised of 160 (32*5) columns. Preferably, there are two redundant paths for each bank of the instruction cache and each bank of the data bank which brings the total number of columns per bank to 130 for the data cache and 162 for the instruction cache. In that particular embodiment of the present invention, there are actually two column redundancy initialization circuits, one for the instruction cache and one for the data cache. The logic of the two initialization circuits is identical, the only difference is the maximum value from which the counter 30 must count down to zero during the shifter initialization operation. The maximum value number is half the total number of columns per bank. The maximum value number is 81 in the case of the instruction cache and 65 in the case of the data cache. The maximum value is hard wired into the corresponding counter circuitry.

Two signals are output from the counter 30. The first, RCOUNT, is a multiple bit signal which is input to each of the eight bank control 70 blocks through the multiple bit RCOUNT signal line 32. The RCOUNT signal provides to the bank control 70 blocks a multiple bit value of the counter 30 as counter 30 decrements from the maximum value to zero. The second output of the counter is the ZERO signal which is input to the master control block 10 through the ZERO signal line 26. The ZERO signal indicates to the master control 10 when the counter 30 has counted to zero thereby signifying that the operation has completed.

Central to the operation of the counter 30 is a multiple-bit D-type flip flop circuit 40 of a type well known in the art. Upon deassertion of the SYSTEM RESET signal into the master control 10, the master control 10 asserts the signals LOAD and ENABLE. The ENABLE signal enables the multiple bit flip flop 40. The LOAD signal is input into a multiplexor 42 which loads the maximum value of the counter 30 into the multiple bit flip flop 40. The LOAD signal is then deasserted by the master controller 10 and remains deasserted throughout the shifter initialization operation. On each PHI-1 clock signal, the multiple bit flip flop 40 outputs a multiple bit counter signal RCOUNT which is input to the bank control 70 through a multiple bit RCOUNT signal line 32. Signal RCOUNT is decremented by one on each PHI-1 clock cycle by decrement-by-one logic 44, input into the multiplexor 42 and then to the multiple bit flip flop 40. Therefore, RCOUNT decrements on each cycle of clock PHI-1 once the counter 30 has been enabled. RCOUNT is also input into a multiple bit NOR-gate 46 which provides the ZERO signal to the master control 10 when the counter 30 has counted down to zero. The ZERO signal indicates the completion of the initialization cycle.

Figure 3:
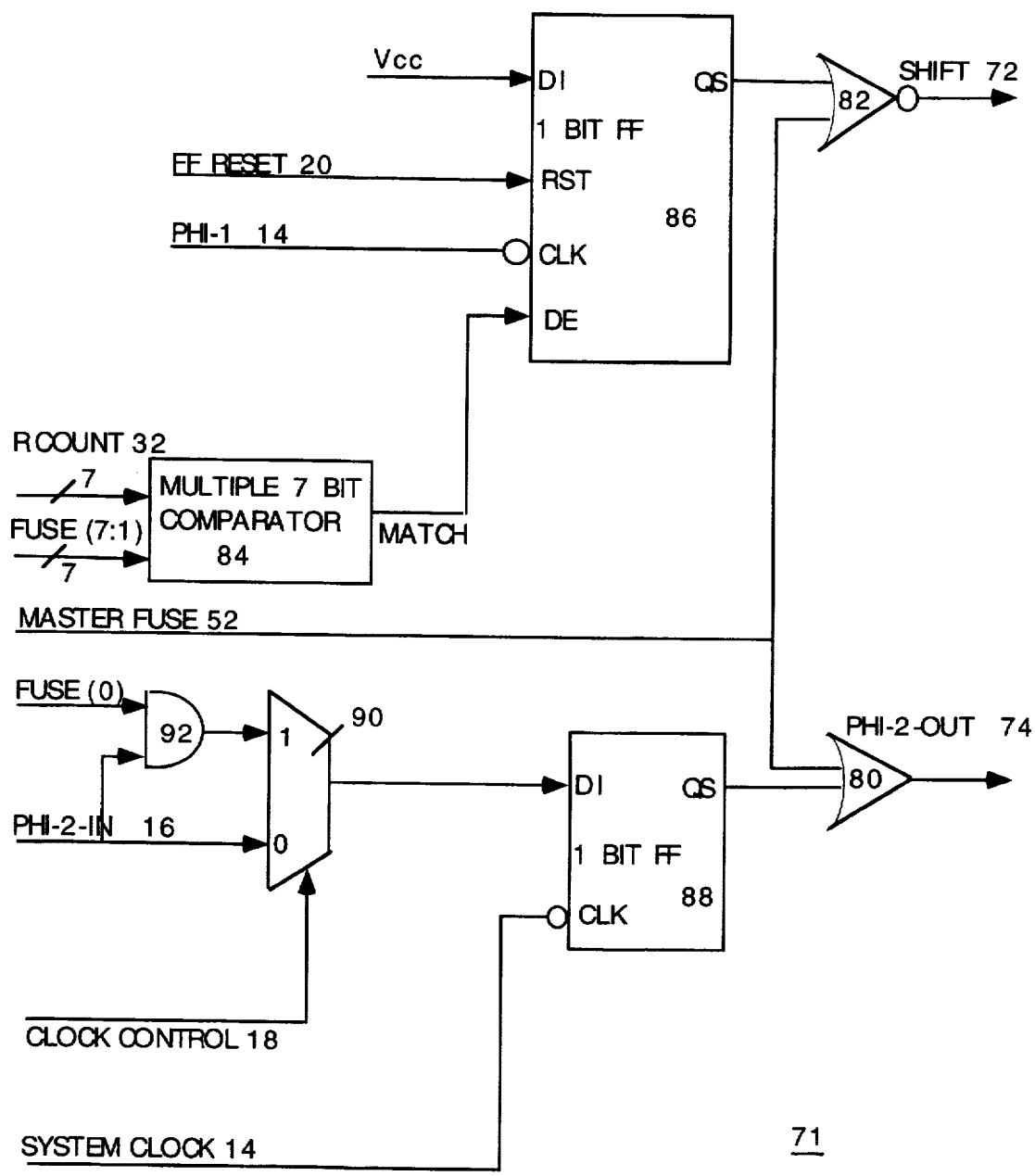
FIG. 3 illustrates a controller for the initialization of an individual bank.

Referring to FIG. 3, an individual bank control 71 circuit is illustrated. There are two outputs from each individual bank control circuit, a SHIFT signal and a PHI-2-OUT signal which are output on SHIFT 72 and PHI-2-OUT 74 signal lines, respectively. The SHIFT signal contains a column shift pattern for the shifter of the bank corresponding to the bank control 70. Not counting the redundant paths, there are half the number of columns plus one or half the number of columns PHI 2-OUT cycles in an initialization operation depending on whether FUSE (0:0) is odd or even respectively. A zero value on the SHIFT signal line 72 indicates that no shift should occur for the particular column, a one value indicates that there should be a shift. Therefore, in the case where there is no need to use column redundancy because the first maximum value columns of a bank are good, the SHIFT signal line will be driven with zeros and the value PHI-1 and PHI-2-OUT is always "1" (infinite shift of zero values) to indicate that there is no need to use the redundant columns because all regular columns are working.

In the case where the first two columns of a bank are bad (i.e. columns zero and one are bad), the SHIFT signal will consist of maximum value ones indicating that all bits should be shifted to repair a failure in the first two columns.

In a more representative case, a bad column or adjacent pair of columns, will appear somewhere between the first and last columns. In an example where columns five and six are defective, the two spare columns of the bank would be used by shifting by two, all columns from column five. In this case, for the first three (each) PHI-1 and PHI-2-OUT cycles, the SHIFT signal would be zero to indicate no need to shift for columns zero to five. On subsequent PHI-1 and PHI-2-OUT cycles, the SHIFT signal shift would have a value of one to indicate that all subsequent columns need to be shifted by two columns. Since the FUSE (0:0) value is odd, there is an additional PHI-2-OUT cycle thus overriding column 5 to be a shift type. Now zero through four columns are not shifted whereas five through 160 are.

As disclosed in the above referenced co-pending application, once a bank shifter has been initialized, the shift pattern will be maintained so long as power is provided to the shifter. The shift clock is stopped (PHI-1 and PHI-2-OUT) to have the shifter maintain its state. In the preferred embodiment of the present invention, the shifter will maintain the shift pattern until power is removed from the system, or until the system is reset, at which time the shifter will be reinitialized.

There are several inputs to a bank control 71. Only one of the inputs, FUSE (7:0) is unique to a particular bank. As described above, FUSE (7:0) provides the location of the column where shifting will begin for a particular bank. Functionally, the bank control 71 can be divided into two sets of circuitry. One set controls the generation of clock signal PHI-2-OUT, the other set controls the generation of the SHIFT signal.

In the preferred embodiment of the present invention, each bank control 71 can be disabled by not blowing the master fuse. As described above, if there is no need for the column redundancy to be implemented, the master fuse is not blown. In that case, the SHIFT signal will be a series of zeros during the shifter initialization operation to indicate that no shift is necessary because all columns are functional. This is accomplished by tying the master fuse signal line 52 as an input to an OR-gate 80 in the PHI-2-OUT clock generation part of a bank control 71 and also tying the master fuse signal line 52 as an input to a NOR-gate 84 in the SHIFT signal output part of the bank control 71.

If the master fuse has been blown, then the bank control 71 will not be disabled. The shift generator part of a bank controller is basically comprised of a multiple bit comparator 84 and a one bit flip flop 86. The multiple bit comparator 84 enables the one bit flip flop 86 when the RCOUNT signal output from the counter 32 is equal to the FUSE (7:1) signal. RCOUNT 32 equals FUSE (7:1) when the counter has counted down to the number of the column where shifting will occur was encoded into the fuse bank 50. A clock signal for the one bit flip flop 86 is provided by the master control 10 and is the PHI-1 signal. The one bit flip flop 86 is reset by the RESET signal from the master control 10. The input to the one bit flip flop 86 is VCC.

The PHI-2-OUT generation circuitry is comprised of a one bit flip flop 88, a multiplexor 90 and an AND-gate 92. The multiplexor 90 is controlled by the master control 10 CLOCK CONTROL signal. When the CLOCK CONTROL signal is zero, PHI-2-IN will be input from the master control 10 into the multiplexor 90 and then to the one bit flip flop 88. When the CLOCK CONTROL signal is one, the PHI-2-IN signal from the master control 10 will be input to the flip flop 90. When the Clock Control Signal is zero an additional PHI-2-OUT is generated based on the FUSE (0:0) value. In this way, the PHI-2-OUT and SHIFT signals necessary to initialize a shifter for a given bank will be generated.

Thus, the present invention implements a column redundancy shifter initialization control circuit in a microprocessor having on-board cache memory comprised of more than one bank. The present invention controls the concurrent initialization of multiple banks with a minimum amount of duplication of circuitry and minimal amount of execution cycles, thereby reducing the amount of the microprocessor chip which must be devoted to control of initialization of the column redundancy shifters and the time to come out of reset state. When combined with the column redundancy shifters of the above-mentioned co-pending application, the present invention improves the yield of microprocessors which contain on-board cache memory in an environment that requires increasing complexity in design and miniaturizations in semi-conductor devices.

While the present invention has been particularly described with reference to FIGS. 1–3 and with emphasis on certain memory structures, it should be understood that the figures are for illustration purposes only and should not be taken as limitations upon the present invention. In addition, it is clear that the method and apparatus of the present invention has utility in any application where redundancy in memory structures are desired. It is contemplated that numerous alternatives, modifications, variations and uses may be made, by one skilled in the art, without departing from the spirit and scope of the invention as disclosed above.

What is claimed is:

1. A circuit for initializing a set of memory banks during a reset state, each memory bank having a set of N primary columns configured adjacent and parallel to each other and adjacent to M redundant columns configured adjacent and parallel to each other where "N" and "M" are predetermined whole numbers, comprising:

a storage circuit including a plurality of storage devices corresponding to each of said set of memory banks, wherein a first plurality of said plurality of storage devices stores detective column indicators representing a location of at least one defective column within a first memory bank of said set of memory banks and a second plurality of said plurality of storage devices stores detective column indicators representing a location of at least one defective column within a second memory bank of said set of memory banks;

a master control circuit, coupled to said storage circuit, configured to generate a maximum clock cycle value, a plurality of clock signals and a signal indicating completion of the reset state;

a counter circuit, coupled to said master control circuit, configured to generate a series of binary signals based on said maximum clock cycle value, said binary signals collectively representing a count value; and a set of bank controllers, corresponding to each of said set of memory banks, wherein a first bank controller of said set of bank controllers, coupled to said first plurality of storage devices and said master control circuit, is configured to (i) generate a first set of shift signals based on said plurality of clock signals, said series of binary signals, and said defective column indicators associated with the first plurality of storage devices and (ii) transmit said first set of shift signals into said first memory bank, and a second bank controller of said set of bank controllers, coupled to said second plurality of storage devices and said master control circuit, is configured to (i) generate a second set of shift signals based on said plurality of clock signals, said series of binary signals, and said defective column indicators associated with the second plurality of storage devices and (ii) transmit said second set of shift signals into said second memory bank.

2. The circuit of claim 1, wherein said counter circuit generates said series of binary signals to be used to calculate both said first and second set of shift signals.

3. The circuit of claim 1, wherein each of said plurality of storage devices provides storage for at least $\log_2(N+M)$ bits, $\log_2((N+M)/M)$ bits for indicating a group of M columns adjacent to a first group of M columns contains said at least one defective column, and $\log_2(M)$ bits for indicating a first defective column within said first group of M columns contains said at least one defective column;

said maximum clock cycle value is equal to $(N+M)/M$; and each of said plurality of clock signals including M overlapping series of non-overlapping clock cycles, each of said M overlapping series having at least $(N+M)/M$ clock cycles.

4. The circuit of claim 3, wherein

M equals 2;

each of said plurality of storage devices provides storage for at least $\log_2(N+2)$ bits, $\log_2((N+2)/2)$ bits for indicating a group of two columns adjacent to a first group of two columns contains at least one defective column, a first bit for indicating a first defective column within said first group of two columns;

said maximum clock cycle value stored in said first circuit is equal to $(N+2)/2$; and said plurality of clock signals includes a first and a second overlapping series of non-overlapping clock cycles, said first series having $(N+2)/2$ clock cycles, said second series having $(N+2)/2$ clock cycles if said first bit has a logic value of "0" to indicate that a first defective column is within said first group of two columns and $((N+2)/2)+1$ clock cycles if said first bit has a logic value of "1" to indicate that a first defective column within said first group of two columns.

5. The circuit as set forth in claim 3, wherein each of said plurality of shift signals includes a first series and a second series of signals; and said first series being generated before one of said series of binary signals produces said count value equal to $\log_2((N+M)/M)$, and said second series being generated thereafter, said first and second series of signals being "shift" and "not shift" signals respectively, if said counter circuit is decrementing said count value and alternatively "not shift" and "shift" signals respectively, if said counter circuit is incrementing said count value.

6. The circuit as set forth in claim 1, said storage circuit includes a master "no-defect" indicator, coupled to said master control circuit, to indicate that none of said N primary columns are defective, wherein said master control circuit generates each of said plurality of clock signals based on (i) said maximum clock cycle value if said master "no-defect" indicator is not set, and alternatively (ii) said master "no-defect" indicator if said master "no-defect" indicator is set, and said set of bank controllers generates each of said series of shift signals based on (i) said stored maximum clock cycle value if said master "no-defect" indicator is not set, and alternatively said master "no-defect" indicator if said "no-defect" indicator is set.

7. The circuit as set forth in claim 6, wherein said master "no-defect" indicator is a master fuse.

8. The circuit as set forth in claim 6, wherein said maximum clock cycle value stored in said master control circuit is equal to $(N+M)/M$ and said plurality of clock signals generated by said master control circuit includes M overlapping series of non-overlapping clock cycles, each of said M series of clock cycles having $(N+M)/M$ clock cycles.

9. The circuit of claim 6, wherein each of said plurality of storage devices is a fuse.

10. A computer system comprising:

a bus for transmitting data;

a display, coupled to said bus, for displaying said data;

a input device, coupled to said bus, for receiving said data;

a memory circuit, coupled to said bus, for storing said data;

a microprocessor, coupled to said bus, for processing said data; and an integrated circuit, coupled to said bus, providing a set of shift signals for initializing a set of memory banks during a reset state, each memory bank having a set of N primary columns configured adjacent and parallel to each other and adjacent to M redundant columns configured adjacent and parallel to each other where "N" and "M" are predetermined whole numbers, said integrated circuit including a storage circuit including a plurality of storage devices corresponding to each of said set of memory banks, wherein a first plurality of said plurality of storage devices stores defective column indicators representing a location of at least one defective column within a first memory bank of said set of memory banks and a second plurality of said plurality of storage devices stores detective column indicators representing a location of at least one defective column within a second memory bank of said set of memory banks, a master control circuit, coupled to said storage circuit, configured to generate a maximum clock cycle value, a plurality of clock signals and a signal indicating completion of the reset state, a counter circuit, coupled to said master control circuit, configured to generate a series of binary signals using said maximum clock cycle value, said binary signals collectively representing a count value, and a set of bank controllers, corresponding to each of said set of memory banks, wherein a first bank controller of said set of bank controllers, coupled to said first plurality of storage devices and said master control circuit, is configured to (i) generate a first set of shift signals based on said plurality of clock signals, said series of binary signals, and said defective column indicators associated with the first plurality of storage devices and (ii) transmit said first set of shift signals into said first memory bank and a second bank controller of said set of bank controllers, coupled to said second plurality of storage devices and said master control circuit, is configured to (i) generate a second set of shift signals based on said plurality of clock signals, said series of binary signals, and said defective column indicators associated with the second plurality of storage devices and (ii) transmit said second set of shift signals into said second memory bank.

11. The computer system of claim 10, wherein said counter circuit generates said series of binary signals to be used to calculate both said first and second set of shift signals.

12. The computer system of claim 10, wherein each of said plurality of storage devices provides storage for at least $\log_2(N+M)$ bits, $\log_2((N+M)/M)$ bits used to indicate a group of M columns adjacent to a first group of M columns contains said at least one defective column, and $\log_2(M)$ bits used to indicate a first defective column within said first group of M columns contains said at least one defective column;

said maximum clock cycle value is equal to $(N+M)/M$; and each of said plurality of clock signals include M overlapping series of non-overlapping clock cycles, each of said M overlapping series having at least $(N+M)/M$ clock cycles.

13. The computer system of claim 12, wherein:

M equals 2;

each of said plurality of storage devices comprises at least $\log_2(N+2)$ bits, $\log_2((N+2)/2)$ bits being used to indicate a group of two columns adjacent to a first group of two columns contains at least one defective column, a first bit being used to indicate a first defective column within said first group of two columns contains at least one defective column;

said maximum clock cycle value stored in said first circuit is equal to $(N+2)/2$; and said plurality of clock signals includes a first and a second overlapping series of non-overlapping clock cycles, said first series having $(N+2)/2$ clock cycles, said second series having $(N+2)/2$ clock cycles if said first bit has a logic value of "0" to indicate that a first defective column is within said first group of two columns and $((N+2)/2)+1)$ clock cycles if said first bit has a logic value of "1" for indicating a first defective column within said first group of two columns.

14. The computer system of claim 12, wherein each of said plurality of shift signals includes a first series and a second series of signals; and said first series being generated before one of said series of binary signals produces said count value equal to said $\log_2((N+M)/M)$, and said second series being generated afterwards, said first and second series of signals being "shift" and "not shift" signals respectively if said counter circuit is decrementing said count value, and alternatively "not shift" and "shift" signals respectively if said counter circuit is incrementing its count value.

15. The computer system of claim 10, further comprising:

a master "no-defect" indicator, coupled to said master control circuit, to indicate that none of said N primary columns are defective, wherein said master control circuit generates each of said plurality of clock signals based on said maximum clock cycle value if said master "no-defect" indicator is not set, and alternatively said master "no-defect" indicator if said master "no-defect" indicator is set, and said set of bank controllers generates each of said series of shift signals based on said maximum clock cycle value if said master "no-defect" indicator is not set, and alternatively, said master "no-defect" indicator if said master "no-defect" indicator is set.

16. The circuit of claim 15, wherein said master "no-defect" indicator is a master fuse.

17. The computer system as set forth in claim 15, wherein said maximum clock cycle value stored in said master control circuit is equal to $(N+M)/M$ and said plurality of clock signals generated by said master control circuit includes M overlapping series of non-overlapping clock cycles, each of said M series of clock cycles having $(N+M)/M$ clock cycles.

18. The computer system of claim 17, wherein

M equals 2;

said maximum clock cycle value stored in said master control circuit is equal to $(N+2)/2$; and said plurality of clock signals generated by said master control circuit includes a first and a second overlapping series of non-overlapping clock cycles, each series having $(N+2)/2$ clock cycles.

19. The computer system 10 of claim 10, wherein each of said plurality of storage devices is a fuse.

* * * * *

UNITED STATES PATENT AND TRADEMARK OFFICE
CERTIFICATE OF CORRECTION

PATENT NO.   :   5,537,665
DATED        :   July 16, 1996
INVENTOR(S)  :   Patel et al.

It is certified that error appears in the above-identified patent and that said Letters Patent is hereby corrected as shown below:

In the title page, item [54] please delete " INTIALIZATION " and insert -- INITIALIZATION --.

In column 12, claim 19 at line 51, please delete " 10 " (first occurrence).

Signed and Sealed this

Eighteenth Day of May, 1999

*Attest:*

Q. TODD DICKINSON

*Attesting Officer*            *Acting Commissioner of Patents and Trademarks*